United States Patent [19]

Lampert

[11] Patent Number: 5,348,784

[45] Date of Patent: Sep. 20, 1994

[54] ANTISTATIC AND CONDUCTIVE CARPET TILE SYSTEM

[75] Inventor: Bruce G. Lampert, Easton, Mass.

[73] Assignee: United Technical Products, Inc., Canton, Mass.

[21] Appl. No.: 908,180

[22] Filed: Jul. 2, 1992

Related U.S. Application Data

[63] Continuation-in-part of Ser. No. 787,372, Nov. 4, 1991, Pat. No. 5,262,229.

[51] Int. Cl.⁵ .................... D03D 27/00; B32B 7/12; B32B 15/04
[52] U.S. Cl. ......................................... 428/92; 428/95; 428/96; 428/97; 428/343; 428/354; 428/355; 428/356
[58] Field of Search .................... 428/92, 95, 96, 97, 428/343, 354, 355, 356

[56] References Cited

U.S. PATENT DOCUMENTS

| | | | |
|---|---|---|---|
| 3,713,960 | 1/1973 | Cochran, II | 428/95 |
| 3,955,022 | 5/1976 | Sands | 428/95 |
| 4,061,811 | 12/1977 | Takase et al. | 428/95 |
| 4,138,519 | 2/1979 | Mitchell | 428/95 |
| 4,269,881 | 5/1981 | Johnson et al. | 428/95 |
| 4,643,931 | 2/1987 | McCullough, Jr. et al. | 428/97 |
| 4,678,694 | 7/1987 | Claessen | 428/95 |
| 4,756,941 | 7/1988 | McCullough et al. | 428/97 |
| 4,770,916 | 9/1988 | Leukel et al. | 428/95 |
| 4,824,498 | 4/1989 | Goodwin et al. | 428/95 |
| 5,102,714 | 4/1992 | Mobley et al. | 428/97 |
| 5,122,404 | 6/1992 | Fowler | 428/95 |
| 5,160,775 | 11/1992 | Yamada | 428/95 |

Primary Examiner—George F. Lesmes
Assistant Examiner—Terrel Morris
Attorney, Agent, or Firm—Kirk Teska

[57] ABSTRACT

A modular antistatic and conductive carpet tile system including antistatic and conductive carpet tiles for ESD control and a conductive releasable adhesive for releasably securing the carpet tiles, each tile has a primary backing layer including conductive filaments, a conductive support strata disposed below said primary backing layer, and tufting woven through said primary backing layer and extending at least partially into said conductive support strata forming a carpet pile above said primary backing layer; the adhesive includes a releasable adhesional substance and a multiplicity of conductive fibers suspended therein forming a conductive matrix throughout the volume of said adhesional substance.

30 Claims, 2 Drawing Sheets

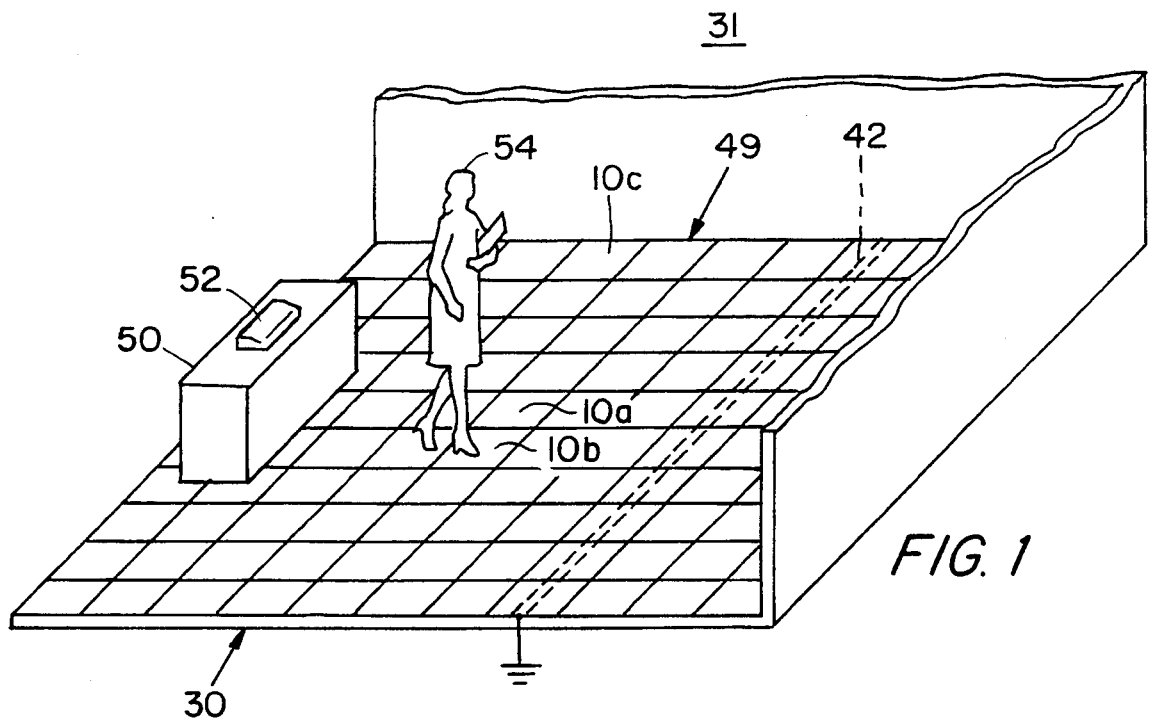
FIG. 1
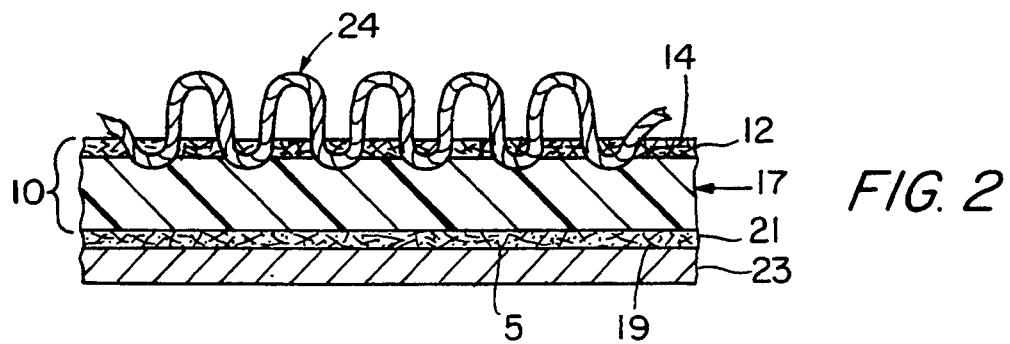
FIG. 2
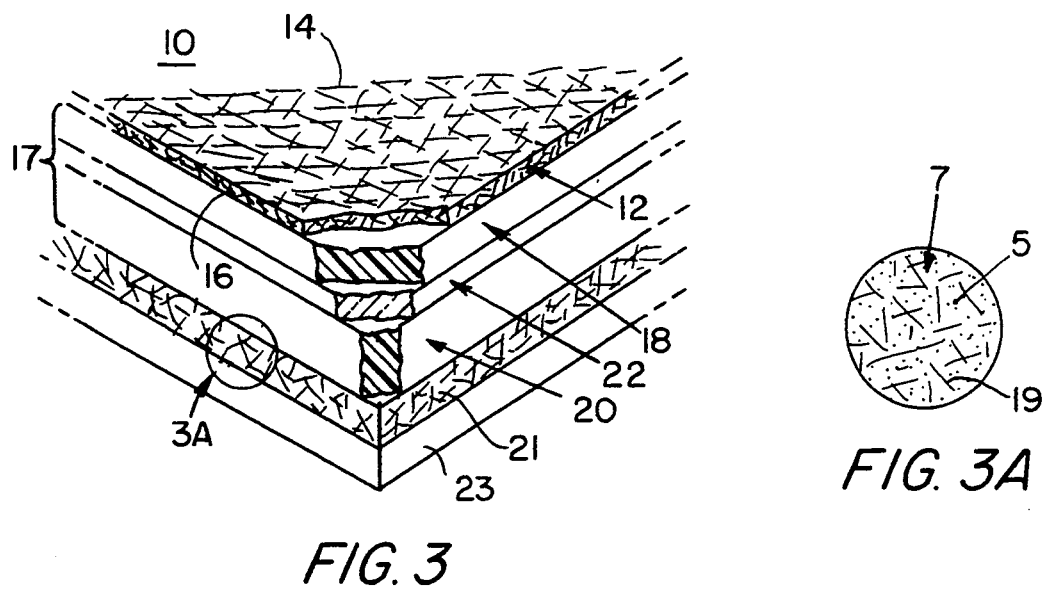
FIG. 3
FIG. 3A

ANTISTATIC AND CONDUCTIVE CARPET TILE SYSTEM

RELATED CASES

This invention is a continuation in part of: "Conductive Releasable Adhesive and Method of Making Same" Ser. No. 07/487,372, filed Nov. 4, 1991 now U.S. Pat. No. 5,262,229.

FIELD OF INVENTION

This invention relates to a modular antistatic and conductive carpet tile system.

BACKGROUND OF INVENTION

The build up and subsequent discharge of static charges from a person to electrical equipment and component parts can cause complete failure of a component, or worse, degradation which might not be discoverable until the component is operated for a time in a system and then fails. The advent of large scale integration of electrical components has resulted in even greater sensitivity to electro-static discharge ("ESD"). ESD, therefore, detrimentally affects quality, reliability, maintainability, and repairability. One estimate of the cost of ESD-caused circuit board and semiconductor handling and equipment disruption and damage is as high as $10 billion per year. Consequently, many devices have been employed to combat ESD in manufacturing and other facilities were electronic components are exposed, assembled, and tested. Hence the competition in the marketplace is fierce.

In the electronic manufacturing environment, these are a plethora of devices used to combat ESD.

There are antistatic smocks and trousers as well as grounding wrist and shoe straps worn by engineers and technicians working on sensitive components. Other devices include air ionizers, humidity measurement and control devices, and protective "pink-poly" and so called "Faraday cage" coverings for electronic components. There are also antistatic coatings and various antistatic sprays. All these devices aid in the reduction of possible ESD damage.

Static charges, however, are primarily generated when people walk across the floor. For example, as much as 15,000 volts can be generated by walking across regular nylon carpet. As much as 5,000 volts can be generated while walking across a linoleum floor. Since a MOSFET device is susceptible to ESD damage in the range of 100–200 volts, a person walking across these types of floorings may seriously damage these and similar type electronic components. Therefore, it has been determined that a holistic approach to ESD control includes controlling static electricity at its prime source—the floor. This is because air ionizers and wrist straps, although effective, require monitoring for proper use and are mainly localized work station solutions to the ESD problem. By reducing triboelectric generation and accumulation of electrostatic charges, and by dissipating any accumulated charges before personnel arrive at the workstation, ESD-protective floor materials find application throughout the electronic manufacturing and testing environment. ESD controlled flooring can be broken down into two categories: Antistatic flooring, and conductive flooring.

The term "antistatic" means the flooring itself resists triboelectric charging. Therefore, antistatic flooring would be nonconductive (having a resistance of between $10^{12}$ and $10^{10}$ ohms). While flooring that is only antistatic does not contribute to the ESD problem it does not clearly solve the problem either. Charges can accumulate on a person standing on the floor by other means, such as by coming into contact with paper that has become charged after passing through a laser printer. Or, the person could have picked up charges while walking across other non-ESD controlled surfaces. Since true antistatic floors are not conductive, these accumulated charges will not dissipate until, perhaps, the person touches an ESD sensitive component.

Conductive floors, of course, have a low resistance which does help in bleeding off any accumulated charges.

Therefore, it has long been recognized that proper flooring should have both antistatic and conductive properties. ESD floor coverings should both inhibit charge generation and quickly bleed off any accumulated charges before a person can "zap" any components.

Conductive rubber floors, conductive epoxy floors, conductive vinyl floor tiles secured with conductive epoxy, and various conductive waxes have been used to combat ESD. The acoustic, comfort, and ergonomic properties of these materials, however, are less than desirable. For example, high noise levels inherent in facilities utilizing vinyl floor tiles affect concentration and interfere with certain precise measurements.

Such floor coverings also detract from the ability to hear abnormal sounds in various equipment during testing and evaluation. Also, these floorings can cause echos and background noise which are distracting to human concentration. For example, hard surface flooring may have a noise reduction coefficiency upwards of 10 times louder than that of carpet flooring. Additionally, walking or standing on hard floors for long periods of time adversely affects human comfort. It has been determined that decreases in human comfort decrease productivity and increases absenteeism. Finally, most hard floorings often pose a serious slip hazard.

Conductive vinyl tiles are often difficult and expensive to maintain. If left unsealed, the porous surface stains easily and is difficult to keep clean. Moreover, if accidentally waxed by maintenance personnel unaware of the conductive properties of the tiles, the tiles are rendered nonconductive. Often, special signs must be included directing maintenance personnel not to wax the tiles with commercial waxes. One manufacturer goes so far as to include special tiles with die cut insert letters of contrasting color reading "CONDUCTIVE FLOOR DO NOT WAX." Furthermore, damaged conductive vinyl tiles require special tools and techniques for replacement. Finally, dust and other contaminants present on vinyl tiles interfere with charge dissipation.

Finally, the configuration of many modern facilities is often in a state of constant flux—remodeling can occur every two or three years or even more frequently. Vinyl tiles may be removed (and sometimes destroyed in the process) while they still have much useful life.

Other types of ESD control surfaces include sealed concrete with conductive paint and epoxy flooring poured over an existing subfloor. But, these floorings have most, if not all, of the limitations of the vinyl floor tiles and waxes discussed above. Conductive waxes often quickly loose their electrical properties, and hence require continuous reapplication which is cost prohibitive in many facilities. The cost of maintaining a hard flooring including waxing, stripping, buffing, and reapplication of the wax can run as high as $2.00 a square foot per year. Therefore, some attempt has been made to develop ESD safe carpet, the maintenance cost of which may be as low as 0.25¢ a square foot per year.

Commercial antistatic nylon has proven safe for an office-type atmosphere, but as discussed above, built up charges are not dissipated by carpet that is only antistatic. Therefore, it is not suitable for facilities where sensitive components are manufactured or tested. The fibers of these and other carpets treated with coatings to make them somewhat antistatic, but the topical treatment wears off with time. Conductive fibers have been added to the yarn of some carpets, to prevent static generation above the human sensitivity level. These types of carpets, however, are not satisfactory for true ESD control since they do not provide a conductive path to ground.

Broad-loom carpet may have conductive fibers interwoven into the yarn and perhaps conductive primary made of polypropylene with carbon coated nylon fibers or a conductive backing made from bituminous latex impregnated with carbon. Broad-loom carpet by definition, however, is not modular. Therefore, as delineated above, worn out portions are difficult to replace. In addition, broad loom carpet have a tendency to buckle and wrinkle under heavy traffic.

Carpet tiles, which must have sufficient rigidity, durability and strength, require vinyl or urethane layers in addition to the primary backing. Adding carbon to vinyl support layers weakens the strength of the carpet face which affects the physical properties of the carpet. Consequently, making carpet tiles sufficiently conductive is inherently more difficult than making broadloom carpet conductive. The problem is compounded when the conductive and antistatic carpet tiles must be releasable to facilitate reconfiguration in the dynamic setting of many electronic and manufacturing facilities.

Conductive epoxies and similar adhesives are inherently non-releasable. Also, because of its consistency, conductive epoxy is difficult to apply. Some attempt was made to render known releasable adhesives conductive by adding carbon powders or liquids, but the result was a great loss of tackiness and strength.

SUMMARY OF INVENTION:

It is therefore an object of this invention to provide a modular antistatic and conductive carpet tile system.

It is a further object of this invention to provide such a modular antistatic and conductive carpet tile system which has sufficient electrical resistance and static generation properties to control electro-static discharge.

It is a further object of this invention to provide such a modular antistatic and conductive carpet tile system which has desirable acoustic, comfort, and ergonomic properties.

It is a further object of this invention to provide such a modular antistatic and conductive carpet tile system which is easy and inexpensive to maintain and reconfigure.

This invention results from the realization that a truly effective modular anti-static and conductive carpet tile system can be effected by antistatic and conductive carpet tiles each including a primary backing layer having conductive fibers and a conductive releasable adhesive for securing the tiles to existing surfaces thereby providing a conductive path-to-ground work surface which also resists the generation of tribo-electric charges.

This invention features a modular antistatic and conductive carpet tile system, the major components of which are antistatic and conductive carpet tiles and a conductive releasable adhesive for releasably securing the tiles to existing surfaces. Also featured is conductive material such as copper foil disposed between the carpet tiles and the releasable adhesive for providing a path to ground for any charges which contact the carpet tiles. Each tile includes a primary backing layer which may be woven polypropylene having conductive filaments such as carbon coated nylon. Each tile also includes a conductive support strata disposed below the primary backing layer which may include a layer of vinyl material including a conductive material such as a plasticizer or silica based metallic coated powder or even a fiberglass scrim sandwiched between upper and lower vinyl sheets. Alternatively, the primary backing layer may be a polypropelene mesh material and the conductive support may be replaced with a layer of vinyl material having carbon particles embedded therein. Or, a precoat layer may be disposed below the primary backing layer and made conductive by embedding carbon particles in polyurethane, latex, or vinyl materials. In that case, the support layer may be vinyl without carbon particles. Tufting which may be yarn interwoven with a conductive filament is woven through the primary backing layer and extends at least partially into the conductive support strata forming a carpet pile above the primary backing layer. The yarn may be BASF Zeftron 500 ZX nylon, and the conductive filament may be a continuous carbon coated nylon conductive monofilament. The tufting may form a loop-pile carpet or a cut pile carpet. The conductive releasable adhesive includes releasable adhesional substance such as PARABOND TM M-277 and a multiplicity of conductive fibers suspended therein forming a conductive matrix throughout the volume of the adhesional substance. The fibers may comprise from between 0.1 to 10 percent of the adhesive by weight, and may be inert with respect to the adhesional substance not adversely affecting its tackiness or adhesive strength. The fibers may be acrylic fibers conductively coated with copper sulfide such as "Thunderon" synthetic conductive fibers or carbon coated nylon or acrylic, or polypropylene conductive fibers. The fibers may have a Denier value of between 0.5 and 25, a diameter of between 0.0005 and 0.0025 inches, and a length of between 0.5 to 0.15 mm. These parameters achieve a conductive matrix with a maximum surface electrical resistance of $2 \times 10^7$ ohms.

DISCLOSURE OF PREFERRED EMBODIMENT

Other objects, features and advantages will occur to those skilled in the art from the following description of a preferred embodiment and the accompanying drawings, in which:

FIG. 1 is a conceptual view of the carpet tile system of the present invention shown in place in a room with a workstation for ESD sensitive components;

FIG. 2 is a conceptualized side sectional view of the carpet tile and conductive releasable adhesive components of the system of the present invention;

FIG. 3 is a three dimensional, sectional, conceptualized view of a carpet tile of the modular carpet tile system according to this invention without tufting showing the primary backing layer, the conductive support strata, and the conductive releasable adhesive;

FIG. 3A is a detailed view of the conductive releasable layer 21 shown in FIG. 3.

Figure 4:
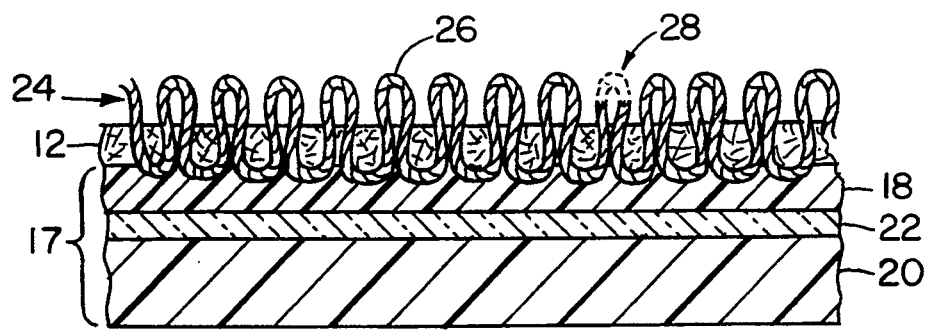
FIG. 4 is a conceptualized side, sectional view of the carpet tile component of the system of this invention showing tufting woven through the primary backing layer and extending into the support strata.

A modular carpet tile system 49, FIG. 1, according to this invention includes carpet tiles 10a, 10b, and 10c on floor 30 of room 31. Workstation 50 may include ESD sensitive component 52 which could become damaged if it were subject to electrostatic charges. According to the present invention however, operator 54, walking across carpet tiles 10a or 10b does not generate any charges since carpet tiles 10a, 10b, and 10c of system 49 are antistatic. Also, if operator 54 does accumulate charges from secondary sources, a ground path is provided from tile 10a to tile 10b and so on to tile 10c and/or along grounding strip 42, shown in phantom, to harmlessly dissipate those charges. Major components of total resistance of the present invention are the carpet tiles themselves and the releasable adhesive used to secure the tiles to existing flooring. These components are discussed in turn. The grounding strips are shown in more detail in relation to FIG. 5.

An individual carpet tile 10, FIG. 2 includes primary backing layer 12 having conductive filaments 14, support strata 17 disposed below primary backing layer 12, and tufting 24 woven through primary backing layer 12 and extending at least partially into conductive support strata 17 forming a carpet pile above the primary backing layer. The conductive releasable adhesive 21 of this system for securing carpet tile 10 to existing surfaces or floor 23 includes a releasable adhesive 5 including conductive fibers 19 shown in more detail in FIG. 3 discussed infra.

In this way, system 31, FIG. 1, provides a resistance of between $2.5 \times 10^4$ to $1.0 \times 10^8$ ohms measured at any point on the surface of system 49 in relation to earth ground using the electrical resistance test of NFPA 99. Since floors are considered static dissipative under $10^9$ ohms, and antistatic between $10^{12}$ and $10^{10}$ ohms, system 31 provides full ESD protection since it is both antistatic and static dissipative. In addition, the system is modular since a releasable conductive adhesive is used to secure the carpet tiles. Also, since carpet tiles are used, acoustic noise levels, human comfort, and slip resistance factors are optimized. Carpet tile 10 has a noise reduction coefficient greater than 0.25 using the ASTM C423-90 sound absorption test.

Figure 6:
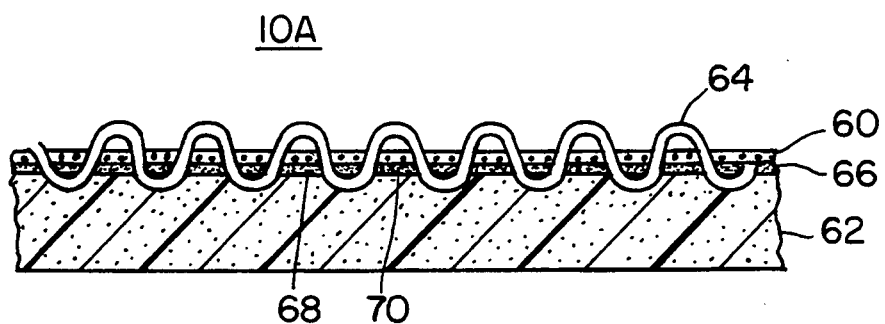
FIG. 6 is a conceptualized side sectional view of another embodiment of the carpet tile of the present invention.

Antistatic and conductive carpet tile 10, shown in greater detail in FIG. 3 and 3A, includes primary backing layer 12 having conductive filaments 14 and 16, shown as representative. Disposed below primary backing layer 12 is conductive support strata 17 which may include upper and lower vinyl layers or sheets 18 and 20. One or both of vinyl layers 18 or 20 may include conductive material such as a plasticizer or silica based metallic coated powder for further facilitating dissipation of any static charges and to ensure a continuous conductive path to ground. Fiberglass scrim 22 may be sandwiched between upper vinyl layer 18 and lower vinyl layer 20 forming conductive support strata 17 in a preferred embodiment. The primary backing layer 12 may be woven polypropylene and the conductive filaments 14 and 16 may be carbon coated nylon. Alternatively, as shown in FIG. 6, in another embodiment, carpet tile 10A includes primary backing layer 60 such as polypropelene mesh material and conductive support layer 62 which may be vinyl material having carbon particles embedded therein. The tufting 64 is woven through primary backing layer 60 and extends at least partially into conductive support layer 62. In addition, precoat layer 66 may be disposed between primary backing layer 60 and support layer 62. Precoat layer 66 may be polyurethane material, latex material, or vinyl material with carbon particles 68, 70, etc., embedded therein.

Tufting 24, FIG. 4, woven through the primary backing layer 12 extends into upper vinyl sheet 18 and forms a carpet pile above primary backing layer 12. Fiberglass scrim 22 and lower vinyl sheet 20 complete the conductive support strata 17 for the carpet tile 10 of FIG. 1. The tufting 24 may be BASF Zeftron 500ZX nylon yarn interwoven with a continuous conductive monofilament 26 in each yarn tuft in a preferred embodiment. Bulk continuous filament 26 also prevents linting and fuzzing which can contaminate equipment and cause down time. The tufting 24 may form a loop-pile carpet as is shown in FIG. 2, or the loops may be cut off as shown in phantom for tuft 28 forming a cut pile carpet. The yarn may tufted with a 1/10 or ⅛ gauge machine, have a weight of 20–40 oz, and may be solution dyed or yarn dyed. Carpet tile 10 may have between 5 to 15 stitches of tufting 24 per inch. Pile heights may range from 0.1 to 0.5 inches above primary backing layer 12 depending on the application. Carpet tile 10 may be 18 inches by 24 inches, or 24 inches by 24 inches in a preferred embodiment.

Tests performed on carpet tile 10, including the general resistance methodology of NFPA 99 and ASTM F-150, and the electrostatic propensity methodology of AATCC-134, and decay rates measured by FSTM 4046(101) revealed carpet tile 10 had static dissipative properties and resistance measurements ideal for ESD protective floor coverings within the parameters discussed above. Static generation test AATCC-134 of system 49, FIG. 1, yielded a reading of less than 0.1 KV with conductive footwear. Static decay of 5,000 volts to zero occurred in less than 0.1 second under the testing methodology of FSTM 4046(101) and static electricity tracked in by a person from 10 KV to 2 KV dissipated in less than 2 seconds. The average of five or more readings between electrodes and floor to ground under the NFPA 99 testing methodology was $2.5 \times 10^4$ ohms to 1.0 33 $10^8$ ohms tested with an applied voltage of 100 volts.

Also shown in FIGS. 2 and 3A is conductive releasable adhesive 21 for securing carpet tile 10 to existing flooring 23. Conductive fibers 19 are suspended in releasable adhesional substance 5 to form an interlaced conductive matrix 7, FIG. 3. In a preferred embodiment, releasable adhesional substance 5 may be a pressure sensitive acrylic polymer aqueous emulsion such as PARABOND TM M-277. Fibers 19 may be acrylic fibers conductively coated with copper sulfide such as "Thunderon" synthetic conductive fibers having a Denier value of between 0.5 and 25, and a diameter of between 0.0005 to 0.0025 inch. Preferably, the fibers have a length of between 0.5 and 15 mm and comprise from 0.1 to 10 percent of adhesive 21 by weight. Conductive fibers other than acrylic fibers coated with copper sulfide could be used as long as they form a conductive matrix with sufficient conductive properties. For example, carbon coated acrylic, nylon, or propylene type conductive fibers could be used.

In a preferred embodiment, "Thunderon" fibers are used having a Denier value of 2, a diameter of about 0.0007 inch, and a length of about 5 mm, and comprising approximately 1% of the total wet weight of the adhesive. Experiments involving these parameters resulted in a conductive releasable adhesive which, before application of the carpet tiles, had a maximum surface electrical resistance of $2 \times 10^7$ ohms using the general testing methodology of ASTM F-150 at a potential of 100 volts. It has been determined that this is ideal for ESD protective floor coverings. Also, these levels have been achieved with fibers which are inert with respect to the releasable adhesional substance—that is, they do not adversely affect any of the inherent properties of the releasable adhesive. Furthermore, it has been found that these parameters result in an adhesive which is easy to apply. Using a 1/16 inch semi-circular notched trowel, the fibers are kept adequately suspended and are spread evenly forming an interlaced conductive matrix having the properties delineated above. Fibers too long get caught in the teeth of the trowel used to apply the adhesive or get caught on the roller used to spread the adhesive. Fibers too short do not provide the required conductivity unless cost prohibitive quantities of short fibers are added.

It has been established that the use of such a conductive releasable adhesive is cost effective over generally available conductive epoxies since the modular carpet tiles are not destroyed upon removal and replacement during reconfiguration of a given space. Furthermore, the set-up time is often much shorter than that of common epoxies. Accordingly, the installation period is shorter further lessening the costs associated with installation.

In application, flooring 23, FIG. 3, is properly prepared and thoroughly cleaned. Using a 1/16 inch semi-circular notched trowel, conductive releasable adhesive 21 is fully spread on the floor 23 to achieve coverage of approximately 30 yards per gallon. The adhesive 21 is allowed to dry for an average of forty minutes. As it dries, adhesive 21 turns from a cloudy to clear appearance if PARABOND TM M-277 is used as the releasable adhesional substance 5. Carpet tiles, are then applied. Adhesive 21 is easily removed from tools, etc., with soapy water followed by a rag dampened in chlorinated solvent. This ease of clean-up is a further advantage over epoxies.

Figure 5:
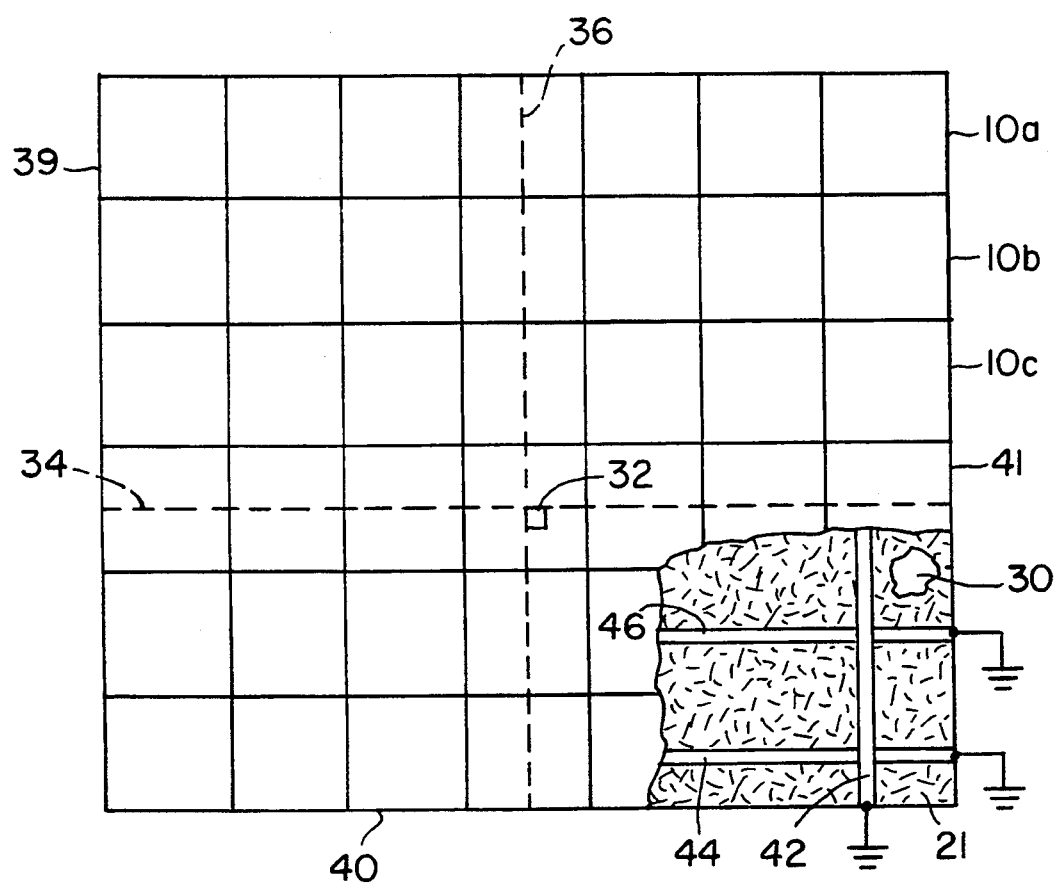
FIG. 5 is a conceptualized view of the carpet tile system of this invention applied to an existing flooring.

Carpet tiles 10a, 10b, an 10c, FIG. 5, are adhered by conductive releasable adhesive 21 on existing flooring surface 30 in room 31 which may have concrete, ceramic tile or terrazzo floors, or steel, wood, or other hard surfaces. After floor 30 is properly prepared and thoroughly cleaned, adhesive 21 is then applied as described above. Grounding strips 42, 44, and 46 which may be 2" wide copper grounding rolls may be then laid the entire length of the installation in strips. As a general guideline, the copper grounding strips should be placed at least approximately 25' apart and then grounded to a hard ground such as a steal beam or an existing wire to ground. Next, suitable starting location 32 is selected which will best utilize the maximum size perimeter tile. Chalk lines 34 and 36, shown in phantom, may be placed on the floor from starting point 32 to each opposite wall 38–41 of room 31 forming a right angle at starting point 32 for a guide in lining up the edges of tiles 10. A pyramiding technique may be used to install tiles 10 one quadrant at a time assuring that the corners of carpet tiles 10 are flat and the seams of adjacent tiles lightly touch. After application and use for a period of time, individual tiles are easily replaced since adhesive 21 is releasable. Also, reconfiguration is simple and inexpensive since the tiles are not destroyed upon removal. Vacuum or steam cleaning is permissible and does not hinder ESD performance of the system.

In this way, the modular antistatic and conductive carpet tile system resists the generation of the triboelectric charges and allows dissipation of any charges generated to ground thereby eliminating potential destruction or stressing of electronic equipment by ESD and at the same time exhibits desirable acoustic, comfort and ergonomic properties and provides for easy and inexpensive maintenance and reconfiguration.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A modular antistatic and conductive carpet tile floor covering that comprises in combination: (a) a plurality of antistatic and conductive carpet tiles for ESD control for being releasably adhered on a floor and (b) a conductive releasable adhesive wherein:

each carpet tile includes a primary backing layer having conductive filaments, a conductive support strata disposed below said primary backing layer, and tufting woven through said primary backing layer and extending at least partially into said conductive support strata forming a carpet pile above said primary backing layer; and the conductive releasable adhesive includes a pressure sensitive acrylic releasable adhesional substance and means for rendering said substance conductive including a multiplicity of conductive fibers suspended in said adhesional substance forming a conductive matrix throughout the volume of said adhesional substance for releasably securing said each tile to said floor.

2. The antistatic and conductive carpet tile floor covering of claim 1 in which said conductive fibers are present in an amount from about 0.1 to 10 percent of the adhesive by weight.

3. The antistatic conductive carpet tile floor covering of claim 1 in which said conductive fibers are inert with respect to said adhesional substance not adversely affecting the tackiness or adhesive strength of said adhesional substance.

4. The antistatic and conductive carpet tile floor covering of claim 1 in which said conductive fibers are acrylic fibers conductively coated with copper sulfide.

5. The antistatic and conductive carpet tile floor covering of claim 1 in which said conductive fibers are carbon coated nylon conductive fibers.

6. The antistatic and conductive carpet tile floor covering of claim 1 in which said conductive fibers are carbon coated acrylic conductive fibers.

7. The antistatic and conductive carpet tile floor covering of claim 1 in which said conductive fibers are carbon coated polypropylene conductive fibers.

8. The antistatic and conductive carpet tile floor covering of claim 1 in which said conductive fibers have a Denier value of between 0.5 and 25.

9. The antistatic and conductive carpet tile floor covering of claim 1 in which said conductive fibers have diameter of between 0.0005 to 0.0025 inches.

10. The antistatic and conductive carpet tile floor covering of claim 1 in which said conductive fibers have a length of between 0.5 to 15 mm.

11. The antistatic and conductive carpet tile floor covering of claim 1 in which said conductive matrix has a maximum surface electrical resistance of $2 \times 10^7$ ohms.

12. The antistatic and conductive carpet tile floor covering of claim 1 in which said primary backing layer is woven polypropylene.

13. The antistatic and conductive carpet tile floor covering of claim 1 in which said conductive filaments are carbon coated nylon.

14. The antistatic and conductive carpet tile floor covering of claim 1 in which said conductive support strata comprises at least one layer of vinyl material.

15. The antistatic and conductive carpet tile floor covering of claim 14 in which said vinyl material layer comprises a conductive material.

16. The antistatic and conductive carpet tile floor covering of claim 15 in which said conductive material is a silica based metallic coated powder.

17. The antistatic and conductive carpet tile floor covering of claim 1 in which said conductive support strata comprises a fiberglass scrim sandwiched between upper and lower vinyl layers.

18. The antistatic and conductive carpet tile floor covering of claim 17 in which at least one of said vinyl layers includes a conductive material.

19. The antistatic and conductive carpet tile floor covering of claim 18 in which said conductive material is a plasticizer.

20. The antistatic and conductive carpet tile floor covering of claim 14 in which said tufting extends into the upper vinyl layer.

21. The antistatic and conductive carpet tile floor covering of claim 1 in which said tufting includes yarn interwoven with at least one conductive filament.

22. The antistatic and conductive carpet tile floor covering of claim 21 in which said filament is a continuous carbon coated nylon conductive monofilament.

23. The antistatic and conductive carpet tile floor covering of claim 1 in which said tufting forms a loop-pile carpet.

24. The antistatic and conductive carpet tile floor covering of claim 1 in which said tufting forms a cut pile carpet.

25. A modular antistatic and conductive carpet tile floor covering that comprises in combination: (a) a plurality of antistatic and conductive carpet tiles for ESD control for being releasably adhered on a floor and (b) a conductive releasable adhesive wherein:

each carpet tile includes a primary backing layer, a conductive support layer disposed below said primary backing layer, a polyurethane precoat layer having carbon particles embedded therein disposed between said primary backing layer and said conducted support layer, and tufting woven through said primary backing layer and extending at least partially into said conductive support layer forming a carpet pile above said primary backing layer; and the conductive releasable adhesive for releasably securing said tiles to existing surfaces which includes a releasable adhesional substance and a multiplicity of conductive fibers suspended therein, said conductive fibers forming a conductive matrix throughout the volume of said adhesional substance.

26. The modular antistatic and conductive carpet tile floor covering of claim 25 in which said primary backing layer is polypropelene mesh material.

27. The modular antistatic and conductive carpet tile floor covering of claim 25 in which said conductive support layer is vinyl material having carbon particles embedded therein.

28. The modular antistatic and conductive carpet tile floor covering of claim 25 in which said precoat layer is latex material having carbon particles embedded therein.

29. The modular antistatic and conductive carpet tile floor covering of claim 25 in which said precoat layer is vinyl material having carbon particles embedded therein.

30. A modular antistatic and conductive carpet tile floor covering that comprises in combination: (a) a plurality of antistatic and conductive carpet tiles for ESD control for being releasably adhered on existing surfaces; (b) a conductive releasable adhesive; and (c) conductive material wherein each tile includes a primary backing layer having conductive filaments, a conductive support strata disposed below said primary backing layer and tufting woven through said primary backing layer and extending at least partially into said conductive support strata forming a carpet pile above said primary backing layer;

the conductive releasable adhesive includes a releasable adhesional substance and means for rendering said substance conductive for releasably securing said tiles to said existing surfaces; and the conductive material is disposed between said carpet tiles and said conductive releasable adhesive for providing a path to ground for any electrical charges which contact said carpet tiles.

* * * * *